United States Patent
Hirahara et al.

(10) Patent No.: US 6,713,682 B1
(45) Date of Patent: Mar. 30, 2004

(54) THROUGH HOLE CONDUCTION STRUCTURE OF FLEXIBLE MULTILAYER CIRCUIT BOARD AND FORMING METHOD THEREOF

(75) Inventors: Kenichi Hirahara, Ushiku (JP); Kunihiko Azeyanagi, Kashima (JP); Toshiyuki Tsukahara, Ushiku (JP)

(73) Assignee: Nippon Mektron, Ltd., Tokyo (JP)

( * ) Notice: Subject to any disclaimer, the term of this patent is extended or adjusted under 35 U.S.C. 154(b) by 236 days.

(21) Appl. No.: 09/786,597

(22) PCT Filed: Jun. 27, 2000

(86) PCT No.: PCT/JP00/04199

§ 371 (c)(1),
(2), (4) Date: Feb. 28, 2001

(30) Foreign Application Priority Data

Jul. 9, 1999 (JP) .............................................. 11-195312

(51) Int. Cl.⁷ .............................. H01R 12/04; H01K 1/11
(52) U.S. Cl. ........................ 174/254; 174/265; 174/266
(58) Field of Search .............................. 174/254–266; 361/793, 795, 749–750; 428/209, 901; 156/248–250

(56) References Cited

U.S. PATENT DOCUMENTS

| | | | | |
|---|---|---|---|---|
| 4,338,149 A | * | 7/1982 | Quaschner | 156/248 |
| 4,687,695 A | * | 8/1987 | Hamby | 428/192 |
| 4,804,615 A | * | 2/1989 | Larson et al. | 430/314 |
| 5,004,639 A | * | 4/1991 | Desai | 428/138 |
| 5,153,987 A | * | 10/1992 | Takahashi et al. | 29/852 |
| 5,374,788 A | * | 12/1994 | Endoh et al. | 174/266 |
| 5,486,655 A | * | 1/1996 | Arike et al. | 174/259 |
| 6,197,425 B1 | * | 3/2001 | Sekimoto et al. | 428/416 |
| 6,339,197 B1 | * | 1/2002 | Fushie et al. | 174/262 |
| 6,392,164 B1 | * | 5/2002 | Iwaki et al. | 174/262 |

FOREIGN PATENT DOCUMENTS

JP     06085406 A  *  3/1994  ............ H05K/1/02

* cited by examiner

Primary Examiner—Evan Pert
Assistant Examiner—Tuan Dinh
(74) Attorney, Agent, or Firm—Alix, Yale & Ristas, LLP

(57) ABSTRACT

In case of manufacturing a flexible multilayer circuit board which comprises an internal layer circuit board which can be a cable portion and an external layer circuit board which can be a component mounting portion laminated on one side or both sides of the internal layer circuit board at a predetermined position and which has a through hole plated conduction portion 12 formed at predetermined positions of the internal layer circuit board and the external layer circuit board, surface protection layers 3 and 5 formed on external surfaces of wiring patterns 1 and 4 of the internal layer circuit board are formed in a region retreated toward the outside from a position of a through hole 13 for a through hole plated conduction portion 12.

2 Claims, 1 Drawing Sheet

THROUGH HOLE CONDUCTION STRUCTURE OF FLEXIBLE MULTILAYER CIRCUIT BOARD AND FORMING METHOD THEREOF

CROSS-REFERENCE TO RELATED APPLICATION

This is the U.S. national phase of International Application No. PCT/JP00/04199 filed Jun. 27, 2000.

TECHNICAL FIELD

The present invention relates to a through hole conduction structure of a flexible multilayer circuit board in which a high-density wiring is required and which has been worked out so as not to generate a crack in a through hole coating layer, and to a forming method thereof.

BACKGROUND ART

Generally, in order to manufacture a multilayer circuit board, an adhesive or an adhesive resin layer called a pre-preg is used on both sides of an internal layer material to laminate and mold a copper-clad laminate. In particular, when laminating a thin multilayer circuit board such as a flexible multilayer circuit board, cover films consisting of, e.g., polyimide resin as an interlayer insulating material are attached on both sides of the internal layer material, and an external layer material is laminated on the obtained product through the adhesive or the pre-preg.

In such a flexible multilayer circuit board, after performing lamination and molding as described above, a through hole process is carried out at a required position of the laminated circuit board and a through hole coating layer is formed in the through hole to attain conduction between the internal layer and the external layer.

However, since the cover film consisting of the polyimide resin has a high thermal expansion coefficient, it expands due to heat from the solder flow having a temperature of approximately 220° C. at component mounting, and a crack is apt to be generated in the through hole coating layer. In the flexible multilayer circuit board in which a high-density wiring Is required, this can be a serious problem as a product.

It is, therefore, an object of the present invention to provide a through hole conduction structure of a flexible multilayer circuit board in which a high-density wiring is required and which is configured so as not to generate a crack in a through hole coating layer, and to a forming method thereof.

DISCLOSURE OF THE INVENTION

To achieve this aim, the present invention provides a through hole conduction structure of a flexible multilayer circuit board comprising an internal layer circuit board which can be a cable portion, and an external layer circuit board which can be a component mounting portion laminated on one side or both sides of the internal layer circuit board at a predetermined position, wherein, in the flexible circuit board having a through hole plated conduction portion formed at predetermined positions of the internal layer circuit board and the external layer circuit board, a surface protection layer formed on an external surface of a wiring pattern of the internal layer circuit board is formed in a region retreated toward the outside from a position of a through hole for the through hole plated conduction portion.

According to the above-described structure, it is possible to preferably eliminate a problem of generation of a crack in the through hole plated conduction portion in the prior art even if a polyimide resin cover film is used for the surface protection layer.

Further, as a forming method for that structure, it is possible to adopt a technique comprising the steps of: forming a required wiring pattern on one side or both sides of a flexible insulating base material; preparing an internal layer circuit board having a surface protection layer formed thereto on an external surface of the wiring pattern at a position retreated toward the outside from a position where a predetermined through hole is to be formed; laminating an external layer circuit board which can be a component mounting portion on one side or both sides of the internal layer circuit board in association with the position of the Internal layer circuit board where the through hole is formed; forming a through hole at predetermined positions of the internal layer circuit board and the external layer circuit board; and forming a through hole plated conduction portion on the inner surface of the through hole.

Since the surface protection layer formed to the internal layer circuit board is provided at a position retreated toward the outside from a position where a predetermined through hole is formed, it is possible to preferably eliminate the adverse influence of thermal expansion on the through hole plated conduction portion even if the polyimide resin cover film is used for the surface protection layer.

BEST MODE FOR CARRYING OUT THE INVENTION

Figure 1:
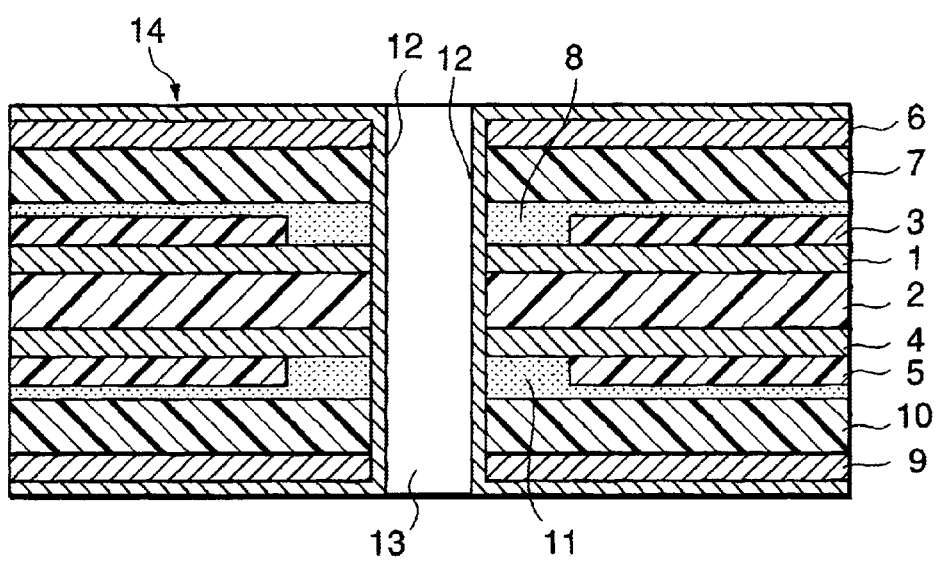
FIG. 1 is a conceptual cross-sectional view of a primary part for explaining a through hole conduction structure of a flexible multilayer circuit board and a forming method thereof according to the present invention.

The present invention will now be described in detail hereinafter with reference to an illustrative embodiment. FIG. 1 is a conceptual cross-sectional view of a primary part for explaining a through hole conduction structure of a flexible multilayer circuit board and a forming method thereof according to the present invention.

In the drawing, required wiring patterns 1 and 4 are formed on both sides of a flexible insulating base material 2 using, e.g., a polyimide film in the usual manner, and surface protection layers 3 and 5 consisting of polyimide films are formed on the external surfaces of the wiring patterns 1 and 4. The inner edges portions of the surface protection layers 3 and 5, however, do not reach the inner wall of a through hole 13 and are provided at positions appropriately retreated from the position of the through hole 13 toward the outside. As an example, when a diameter of the through hole 13 is 0.3 mm, there are used surface protection layers 3 and 5 each of which has a hole of 0.7 mm formed thereto at a corresponding position.

The flexible insulating base material 2, the wiring patterns 1 and 4, and the surface protection layers 3 and 5 can constitute an internal layer flexible circuit board, and an illustrated part corresponds to a position for constituting a component mounting portion. The internal layer flexible circuit board extends from this part toward the outside as a cable portion.

On the both sides of the internal layer flexible circuit board, single-sided copper-clad laminate having the conduction layers 6 and 9 consisting of copper foils and the like are superimposed on the flexible insulating base materials 7 and 10 consisting of polyimide films through adhesive layers 8 and 11 of the pre-preg to constitute respective external layer circuit boards each of which can be a mounting portion.

Thereafter, upon forming a through hole 13 by NC drill means and the like, a through hole plated conduction portion 12 is formed by both using electroless plating means and electrolytic plating means, and a required wiring pattern is formed to the conduction layer of each external layer circuit board, thereby constituting a hybrid flexible multilayer circuit board 14 having a component mounting portion.

In the above description, the polyimide double-sided copper-clad laminate having a copper foil with the thickness of 18 μm, an adhesive layer with the thickness of 18 μm and a polyimide layer with the thickness of 25 μm is used for the internal layer flexible circuit board, and the polyimide single-sided copper-clad laminate having a copper foil with the thickness of 18 μm. an adhesive layer with the thickness of 18 μm and a polyimide layer with the thickness of 25 μm is used for the external layer circuit board. Further, the pre-preg of 100 μm is used for each of the adhesive layers 8 and 11.

INDUSTRIAL APPLICABILITY

According to the through hole conduction structure of a flexible multilayer circuit board and a forming method thereof of the present invention, the surface protection layer formed on the external surface of the wiring pattern of the internal layer circuit board can be formed in a region retreated toward the outside from a position of the through hole for the through hole plated conduction portion. Therefore, even if the polyimide resin cover film as the surface protection layer for the wiring pattern expands due to heat from the solder flow, the risk of generation of a crack and the like in the through hole plated conduction portion which has been observed in the prior art can be eliminated since the surface protection layer does not exist in the through hole region, thereby stably providing the highly reliable hybrid flexible multilayer circuit board in which the high-density wiring is required and the component mounting is enabled.

What is claimed is:

1. A through hole conduction structure of a flexible multilayer circuit board, comprising: an internal layer circuit board having a wiring pattern and an external layer circuit board laminated on one side or both sides of said internal layer circuit board, a through hole plated conduction portion formed in said internal layer circuit board and said external layer circuit board, a surface protection layer formed on an external surface of the wiring pattern, said surface protection layer having a retreated portion which is outwardly retreated from the outside edge of the through hole; wherein the ratio of the diameter of the through hole and the diameter of the outwardly retreated portion is about 1 to 2.3.

2. A through hole conduction structure of a flexible multilayer circuit board according to claim 1, wherein the diameter of the through hole is about 0.3 mm and the diameter of the outwardly retreated portion is about 0.7 mm.

* * * * *